United States Patent
Tappan et al.

(10) Patent No.: US 8,552,334 B2
(45) Date of Patent: Oct. 8, 2013

(54) ADJUSTABLE GAP CAPACITIVELY COUPLED RF PLASMA REACTOR INCLUDING LATERAL BELLOWS AND NON-CONTACT PARTICLE SEAL

(75) Inventors: James E. Tappan, Fremont, CA (US); Scott Jeffery Stevenot, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 1278 days.

(21) Appl. No.: 12/367,754

(22) Filed: Feb. 9, 2009

(65) Prior Publication Data
US 2009/0200268 A1    Aug. 13, 2009

Related U.S. Application Data

(63) Continuation of application No. 61/006,985, filed on Feb. 8, 2008.

(51) Int. Cl.
*B23K 10/00*    (2006.01)

(52) U.S. Cl.
USPC ............ 219/121.48; 219/121.43; 219/121.58; 156/345.33; 156/345.47; 156/345.51

(58) Field of Classification Search
USPC ............ 219/121.41, 121.43, 121.44, 121.57, 219/121.58; 156/345.1, 345.48, 345.33, 156/345.51
See application file for complete search history.

(56) References Cited

U.S. PATENT DOCUMENTS

| 5,534,751 A | 7/1996 | Lenz et al. |
|---|---|---|
| 5,948,704 A | 9/1999 | Benjamin et al. |
| 6,287,435 B1 | 9/2001 | Drewery et al. |
| 2003/0082466 A1 | 5/2003 | del Puerto et al. |
| 2003/0154922 A1 | 8/2003 | House |
| 2005/0051520 A1 | 3/2005 | Tanaka |
| 2007/0284045 A1 | 12/2007 | Fischer et al. |
| 2008/0171444 A1* | 7/2008 | Dhindsa et al. ............... 438/729 |

FOREIGN PATENT DOCUMENTS

| JP | 04-003927 A | 1/1992 |
|---|---|---|
| JP | 04-343222 A | 11/1992 |
| JP | 2007-194361 A | 8/2007 |
| KR | 10-1998-027492 A | 7/1998 |
| KR | 10-2002-031219 A | 5/2002 |
| WO | WO 95/30031 | 11/1995 |

OTHER PUBLICATIONS

International Search Report and Written Opinion mailed Jul. 27, 2009 for PCT/US2009/000784.
Official Action dated Oct. 23, 2012 for Japanese Appln. No. 2010-545887.

* cited by examiner

*Primary Examiner* — Brian Jennison
(74) *Attorney, Agent, or Firm* — Buchanan Ingersoll & Rooney PC

(57) ABSTRACT

A plasma processing chamber includes a cantilever assembly and at least one vacuum isolation member configured to neutralize atmospheric load. The chamber includes a wall surrounding an interior region and having an opening formed therein. A cantilever assembly includes a substrate support for supporting a substrate within the chamber. The cantilever assembly extends through the opening such that a portion is located outside the chamber. The chamber includes an actuation mechanism operative to move the cantilever assembly relative to the wall.

17 Claims, 7 Drawing Sheets

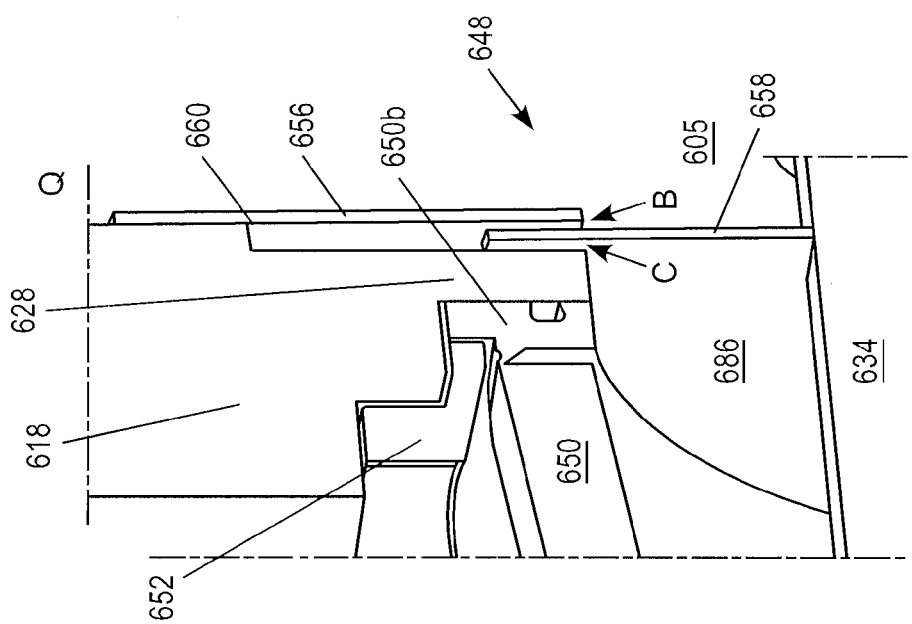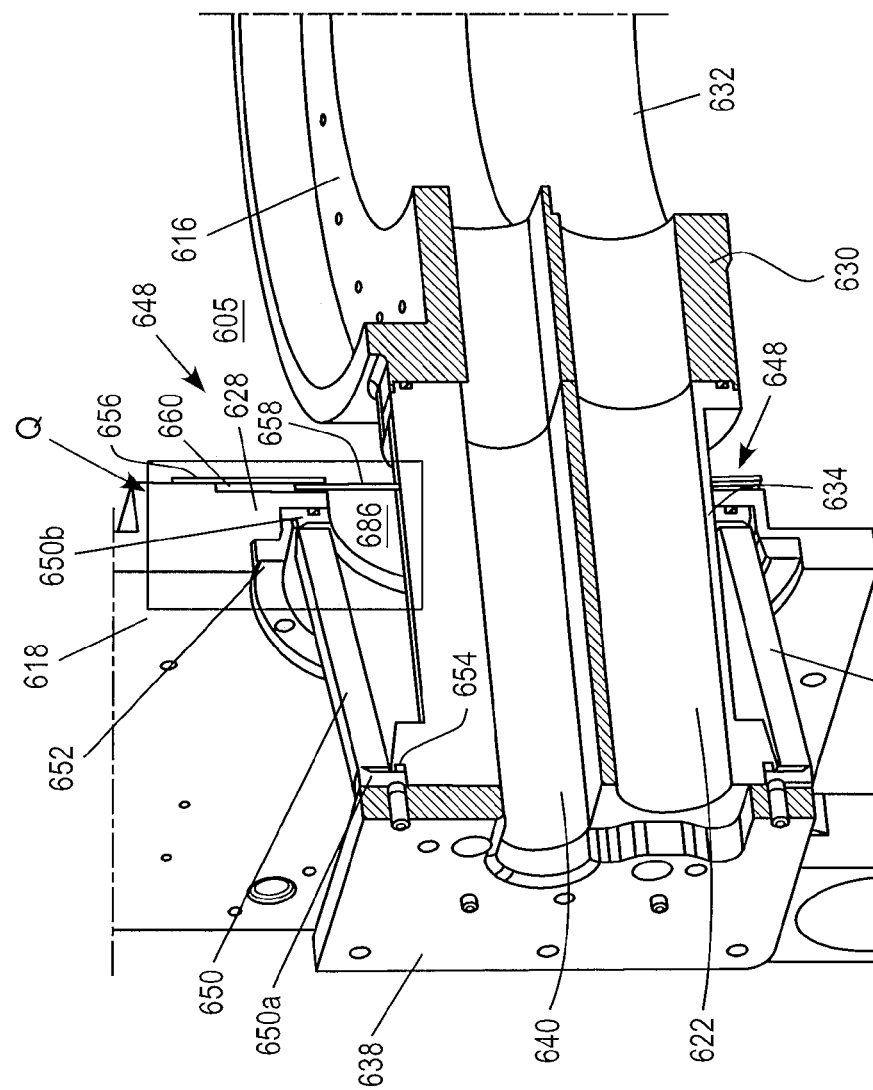

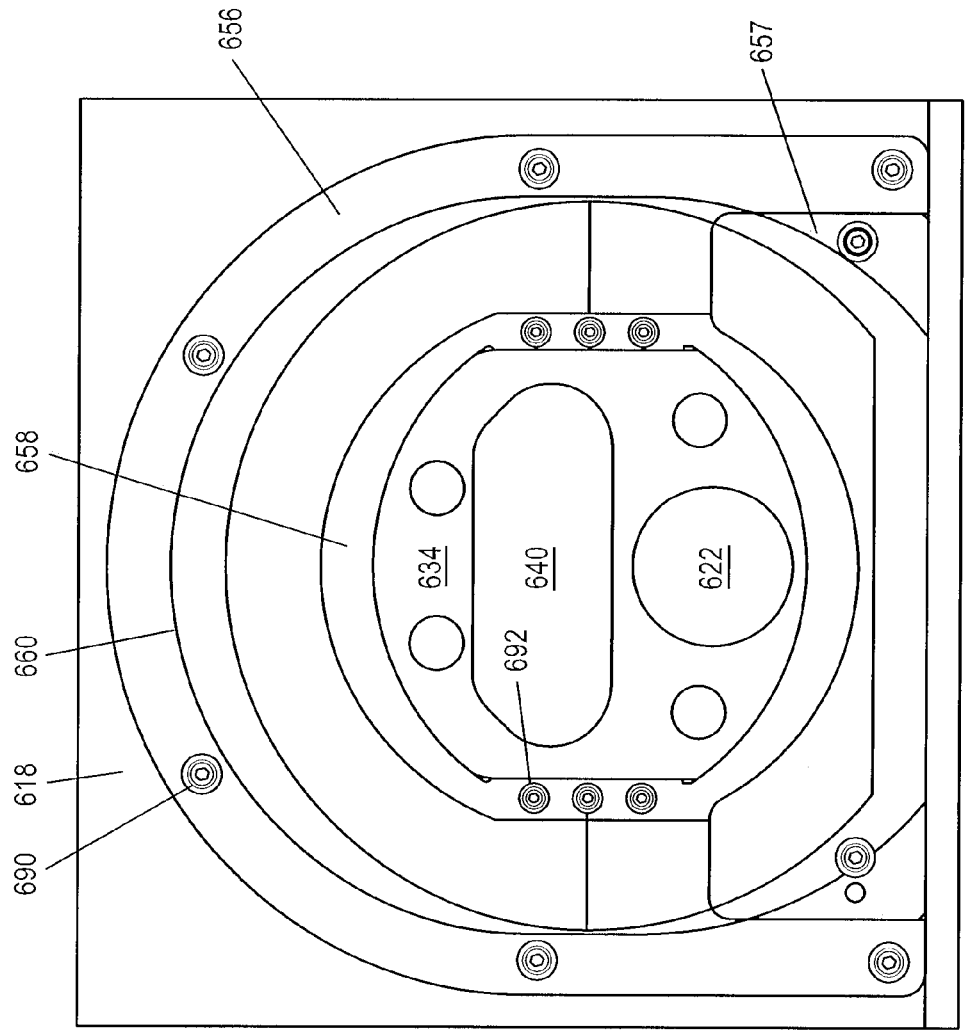
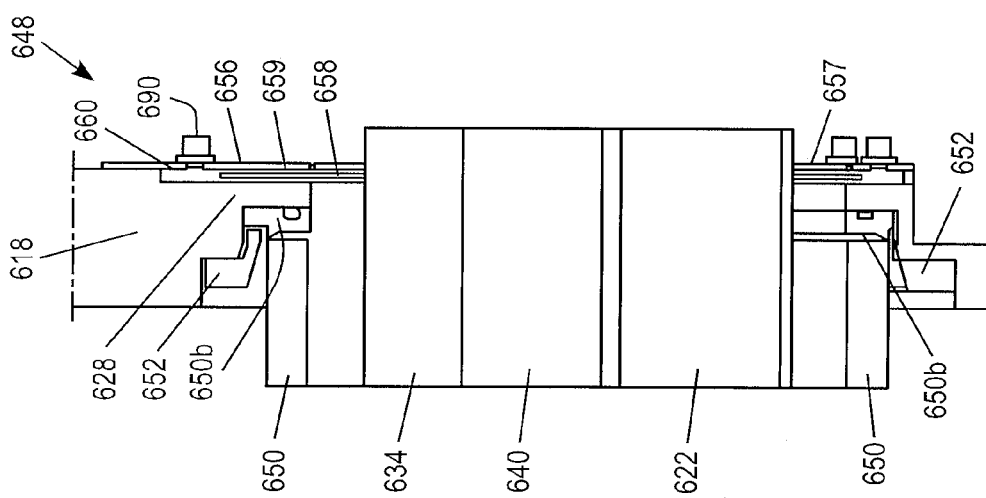
FIG. 5B
FIG. 5A

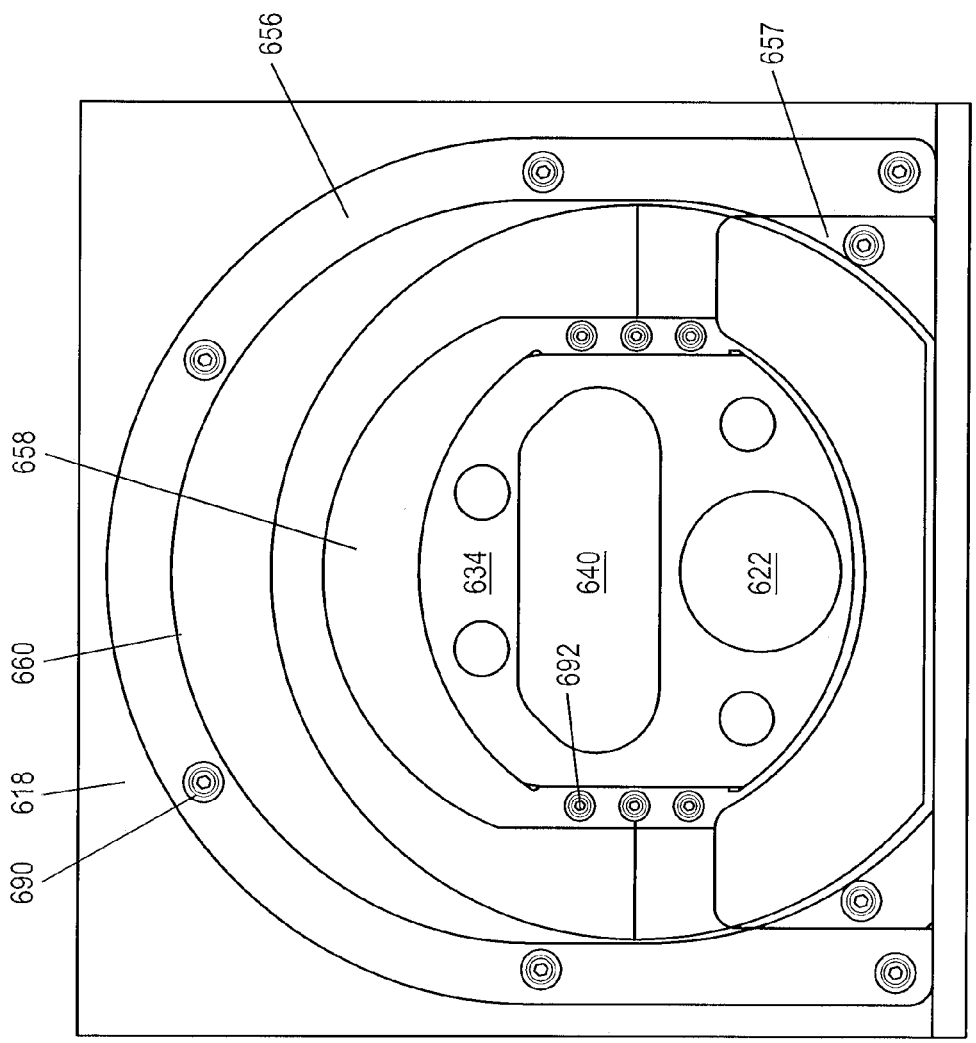
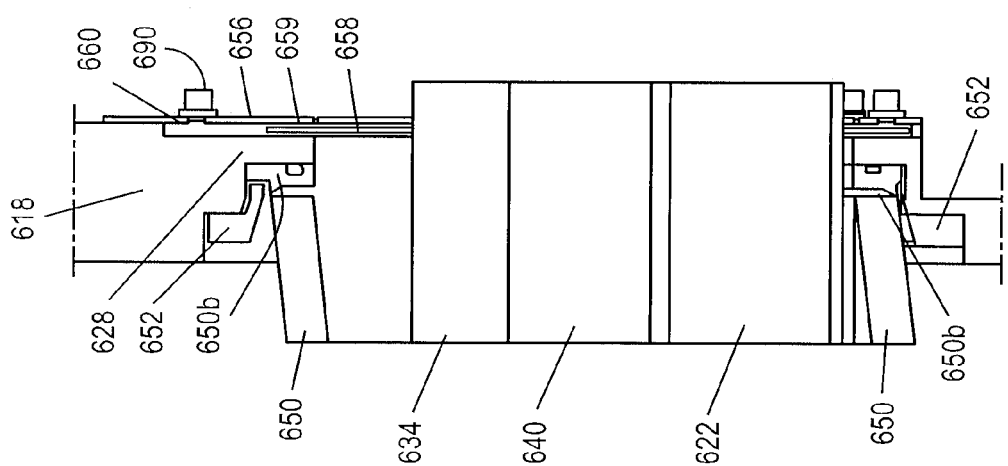
FIG. 6B
FIG. 6A

ADJUSTABLE GAP CAPACITIVELY COUPLED RF PLASMA REACTOR INCLUDING LATERAL BELLOWS AND NON-CONTACT PARTICLE SEAL

CROSS-REFERENCE TO RELATED APPLICATIONS

This application claims priority under 35 U.S.C. §119 to U.S. Provisional Application No. 61/006,985 entitled ADJUSTABLE GAP CAPACITIVELY COUPLED RF PLASMA REACTOR INCLUDING LATERAL BELLOWS AND NON-CONTACT PARTICLE SEAL and filed on Feb. 8, 2008, the entire content of which is hereby incorporated by reference.

BACKGROUND

The shrinking feature sizes and the implementation of new materials in next generation of device fabrication have put new requirements on plasma processing equipment. The smaller device features, larger substrate size and new processing techniques (multistep recipes such as for Dual Damascene Etch) have increased the challenge to maintain good uniformity across the wafer for better device yields.

SUMMARY

An embodiment of a plasma processing apparatus includes a chamber comprising a sidewall surrounding an interior region and having an opening; a cantilever assembly comprising an arm unit extending through the opening of the sidewall and having an outer portion located outside the interior region, and a substrate support on the arm unit and disposed within the interior region; an actuation mechanism coupled to the outer portion of the arm unit and operative to move the cantilever assembly in a vertical direction and bellows arrangement providing a vacuum seal between the arm unit and the sidewall.

BRIEF DESCRIPTION OF THE DRAWINGS

FIG. 3 illustrates a partial cut away view of an embodiment of the lateral bellows shown in FIGS. 1A-C.

FIG. 4 shows an enlarged detailed of box Q in FIG. 3 showing details of moveable bellows shield plate and fixed bellows shield.

FIGS. 5A and 5B show partial cross sectional and end views of an embodiment of a labyrinth seal when a lower electrode is in a mid position (medium gap).

FIGS. 6A and 6B show partial cross sectional and end views of the embodiment of FIGS. 5A and 5B when the lower electrode is in a low position (large gap).

DETAILED DESCRIPTION

Figure 1A:
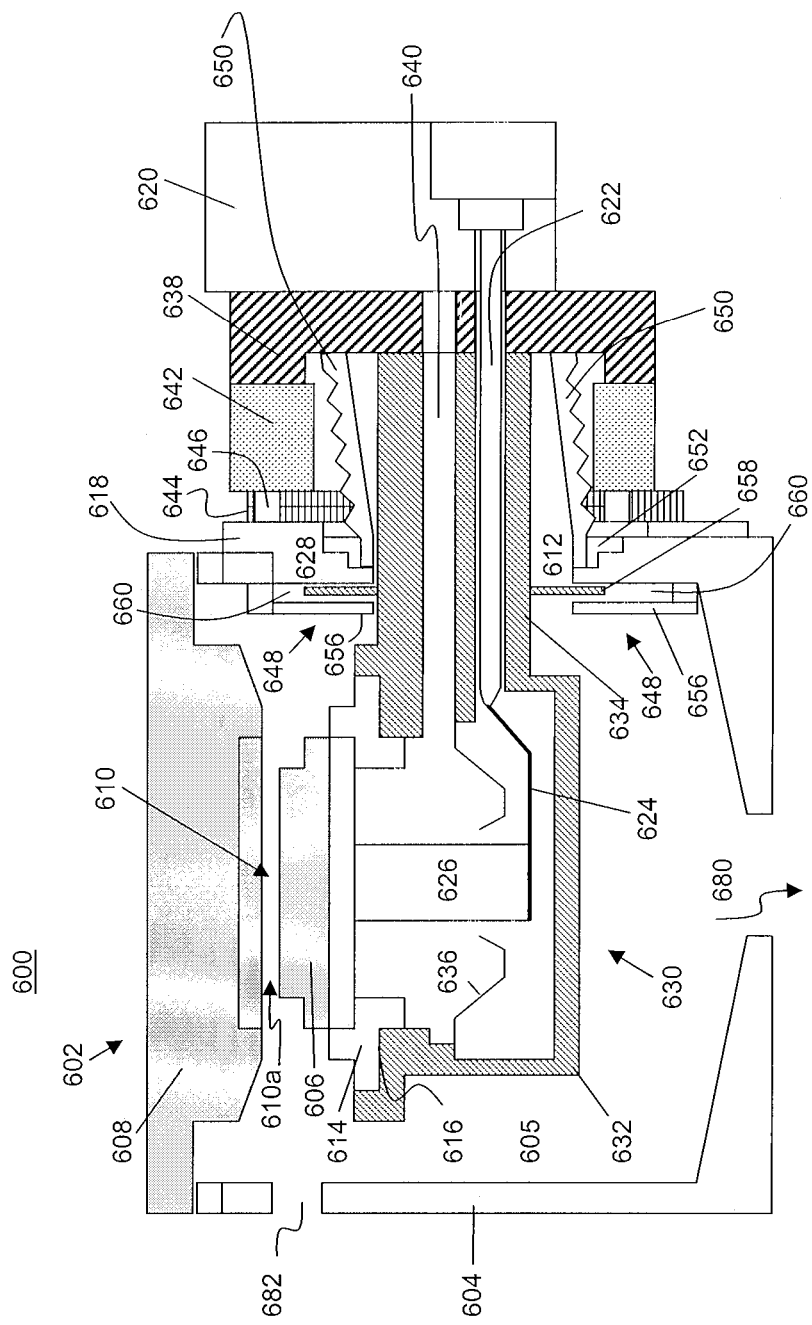
FIGS. 1A-C show an embodiment of an adjustable gap capacitively coupled confined RF plasma reactor including lateral bellows and a non-contact particle seal.
Figure 1B:
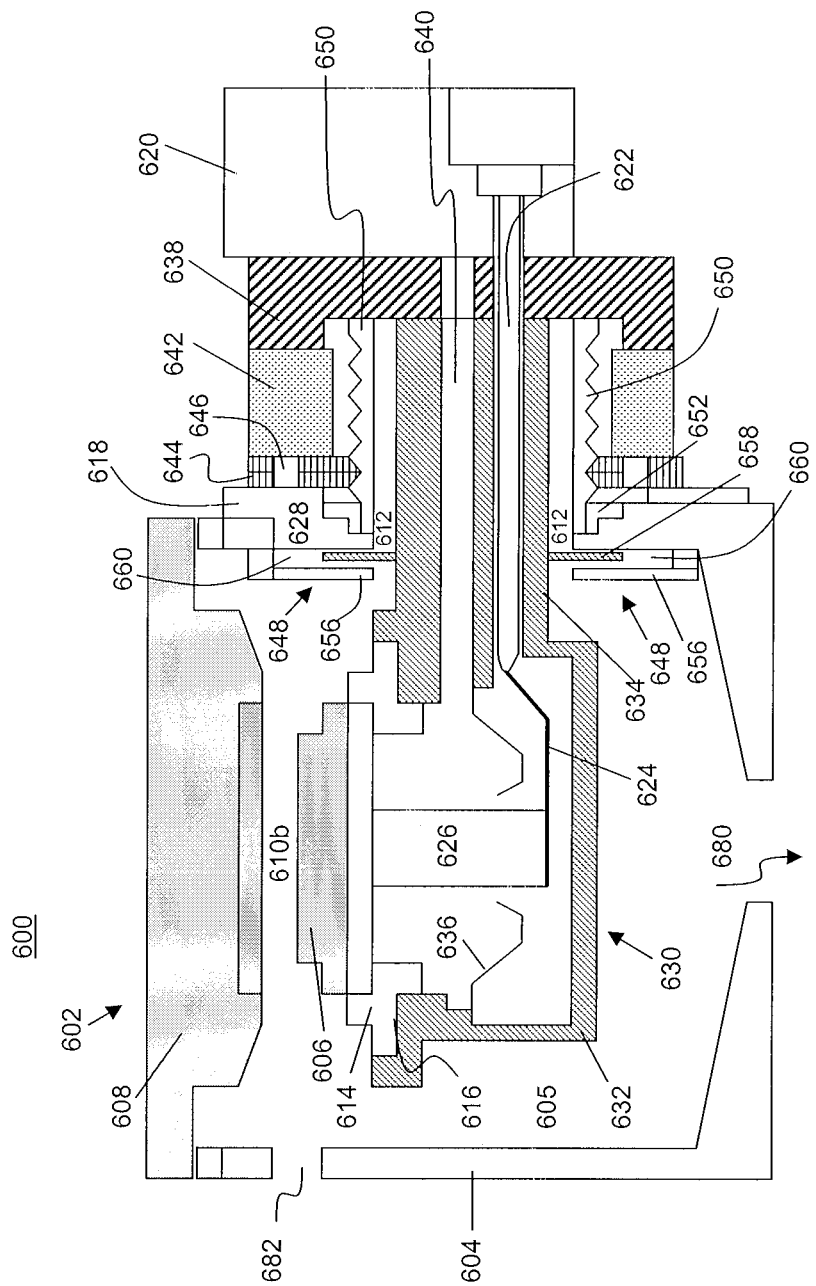
Figure 1C:
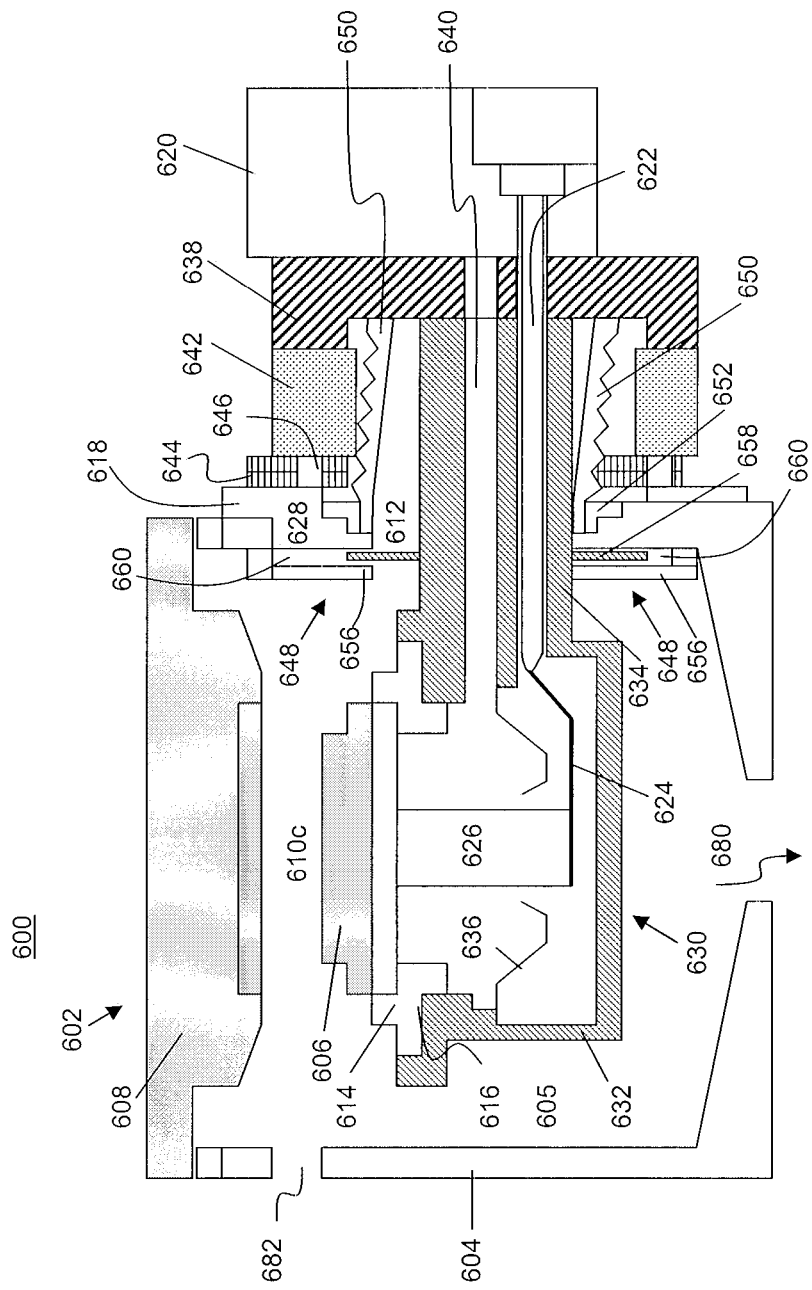

FIGS. 1A-1C illustrate an embodiment of an adjustable gap capacitively coupled confined RF plasma reactor 600. As depicted, a vacuum chamber 602 includes a chamber housing 604, surrounding an interior space housing a lower electrode 606. In an upper portion of the chamber 602 an upper electrode 608 is vertically spaced apart from the lower electrode 606. Planar surfaces of the upper and lower electrodes 608, 606 are substantially parallel and orthoganol to the vertical direction between the electrodes. Preferably the upper and lower electrodes 608, 606 are circular and coaxial with respect to a vertical axis. A lower surface of the upper electrode 608 faces an upper surface of the lower electrode 606. The spaced apart facing electrode surfaces define an adjustable gap 610 therebetween. During operation, the lower electrode 606 is supplied RF power by an RF power supply (match) 620. RF power is supplied to the lower electrode 606 though an RF supply conduit 622, an RF strap 624 and an RF power member 626. A grounding shield 636 may surround the RF power member 626 to provide a more uniform RF field to the lower electrode 606. As described in commonly-owned co-pending U.S. Patent Application Publication No. 2008/0171444, the entire contents of which are herein incorporated by reference, a wafer is inserted through wafer port 682 and supported in the gap 610 on the lower electrode 606 for processing, a process gas is supplied to the gap 610 and excited into plasma state by the RF power. The upper electrode 608 can be powered or grounded.

In the embodiment shown in FIGS. 1A-1C, the lower electrode 606 is supported on a lower electrode support plate 616. An insulator ring 614 interposed between the lower electrode 606 and the lower electrode Support plate 616 insulates the lower electrode 606 from the support plate 616.

An RF bias housing 630 supports the lower electrode 606 on an RF bias housing bowl 632. The bowl 632 is connected through an opening in a chamber wall plate 618 to a conduit support plate 638 by an arm 634 of the RF bias housing 630. In a preferred embodiment, the RF bias housing bowl 632 and RF bias housing arm 634 are integrally formed as one component, however, the arm 634 and bowl 632 can also be two separate components bolted or joined together.

The RF bias housing arm 634 includes one or more hollow passages for passing RF power and facilities, such as gas coolant, liquid coolant, RF energy, cables for lift pin control, electrical monitoring and actuating signals from outside the vacuum chamber 602 to inside the vacuum chamber 602 at a space on the backside of the lower electrode 606. The RF supply conduit 622 is insulated from the RF bias housing arm 634, the RF bias housing arm 634 providing a return path for RF power to the RF power supply 620. A facilities conduit 640 provides a passageway for facility components. Further details of the facility components are described in U.S. Pat. No. 5,948,704 and commonly-owned co-pending U.S. Patent Application Publication No. 2008/0171444 and are not shown here for simplicity of description. The gap 610 is preferably surrounded by a confinement ring assembly (not shown), details of which can be found in commonly owned published U.S. Patent Publication No. 2007/0284045 herein incorporated by reference.

The conduit support plate 638 is attached to an actuation mechanism 642. Details of an actuation mechanism are described in commonly-owned co-pending U.S. Patent Publication No. 2008/0171444 incorporated herein by reference. The actuation mechanism 642, such as a servo mechanical motor, stepper motor or the like is attached to a vertical linear bearing 644, for example, by a screw gear 646 such as a ball screw and motor for rotating the ball screw. During operation to adjust the size of the gap 610, the actuation mechanism 642 travels along the vertical linear bearing 644. FIG. 1A illustrates the arrangement when the actuation mechanism 642 is at a high position on the linear bearing 644 resulting in a small gap 610a. FIG. 1B illustrates the arrangement when the actuation mechanism 642 is at a mid position on the linear bearing 644. As shown, the lower electrode 606, the RF bias housing 630, the conduit support plate 638, the RF power supply 620 have all moved lower with respect to the chamber housing 604 and the upper electrode 608, resulting in a medium size gap 610b.

FIG. 1C illustrates a large gap 610c when the actuation mechanism 642 is at a low position on the linear bearing. Preferably, the upper and lower electrodes 608, 606 remain co-axial during the gap adjustment and the facing surfaces of the upper and lower electrodes across the gap remain parallel.

This embodiment allows the gap 610 between the lower and upper electrodes 606, 608 in the CCP chamber 602 during multi-step process recipes (BARC, HARC, and STRIP etc.) to be adjusted, for example, in order to maintain uniform etch across a large diameter substrate such as 300 mm wafers or flat panel displays. In particular, this embodiment pertains to a mechanical arrangement to facilitate the linear motion necessary to provide the adjustable gap between lower and upper electrodes 606, 608.

FIG. 1A illustrates laterally deflected bellows 650 sealed at a proximate end to the conduit support plate 638 and at a distal end to a stepped flange 628 of chamber wall plate 618. The inner diameter of the stepped flange defines an opening 612 in the chamber wall plate 618 through which the RF bias housing arm 634 passes.

The laterally deflected bellows 650 provides a vacuum seal while allowing vertical movement of the RF bias housing 630, conduit support plate 638 and actuation mechanism 642. The RF bias housing 630, conduit support plate 638 and actuation mechanism 642 can be referred to as a cantilever assembly. Preferably, the RF power supply 620 moves with the cantilever assembly and can be attached to the conduit support plate 638. FIG. 1B shows the bellows 650 in a neutral position when the cantilever assembly is at a mid position. FIG. 1C shows the bellows 650 laterally deflected when the cantilever assembly is at a low position.

A labyrinth seal 648 provides a particle barrier between the bellows 650 and the interior of the plasma processing chamber housing 604. A fixed shield 656 is immovably attached to the inside inner wall of the chamber housing 604 at the chamber wall plate 618 so as to provide a labyrinth groove 660 (slot) in which a movable shield plate 658 moves vertically to accommodate vertical movement of the cantilever assembly. The outer portion of the movable shield plate 658 remains in the slot at all vertical positions of the lower electrode 606.

In the embodiment shown, the labyrinth seal 648 includes a fixed shield 656 attached to an inner surface of the chamber wall plate 618 at a periphery of the opening 612 in the chamber wall plate 618 defining a labyrinth groove 660. The movable shield plate 658 is attached and extends radially from the RF bias housing arm 634 where the arm 634 passes through the opening 612 in the chamber wall plate 618. The movable shield plate 658 extends into the labyrinth groove 660 while spaced apart from the fixed shield 656 by a first gap (channel "B" in FIG. 4) and spaced apart from the interior surface of the chamber wall plate 618 by a second gap (channel "C" in FIG. 4) allowing the cantilevered assembly to move vertically. The labyrinth seal 648 blocks migration of particles spalled from the bellows 650 from entering the vacuum chamber interior 605 (FIG. 2) and blocks radicals from process gas plasma from migrating to the bellows 650 where the radicals can form deposits which are subsequently spalled.

FIG. 1A shows the movable shield plate 658 at a higher position in the labyrinth groove 660 above the RF bias housing arm 634 when the cantilevered assembly is in a high position (small gap 610a). FIG. 1C shows the movable shield plate 658 at a lower position in the labyrinth groove 660 above the RF bias housing arm 634 when the cantilevered assembly is in a low position (large gap 610c). FIG. 1B shows the movable shield plate 658 in a neutral or mid position within the labyrinth groove 660 when the cantilevered assembly is in a mid position (medium gap 610b). While the labyrinth seal 648 is shown as symmetrical about the RF bias housing arm 634, in other embodiments the labyrinth seal 648 may be asymmetrical about the RF bias arm 634.

Figure 2:
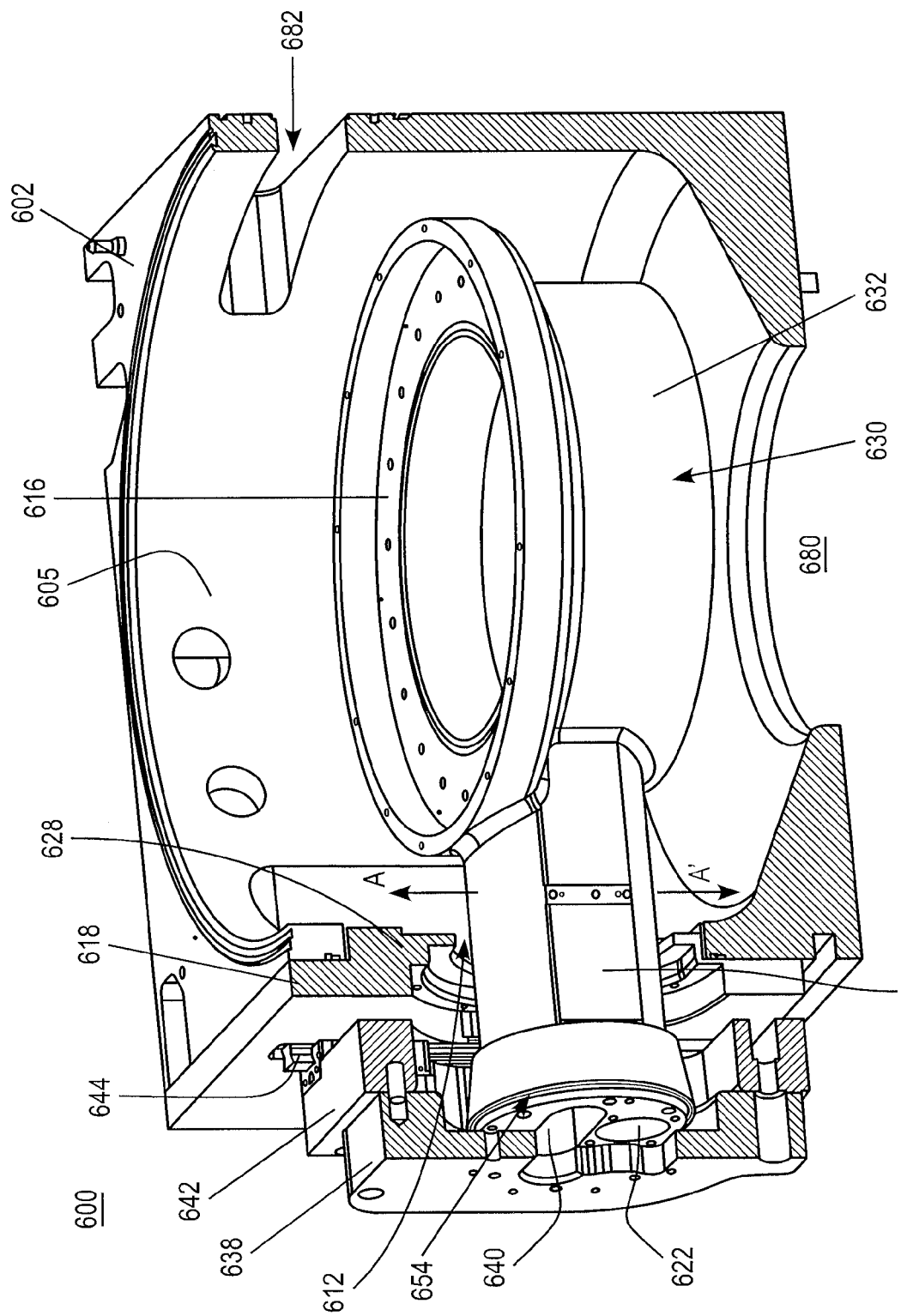
FIG. 2 shows an embodiment of a cantilever mounted RF bias housing allowing the lower electrode to translate vertically for an adjustable gap plasma reactor chamber.

FIG. 2 shows an embodiment of components of a cantilever assembly in an adjustable gap capacitively coupled confined RF plasma reactor. The components are shown partially cut away and without other components for ease of description. In the illustration, the RF bias housing 630 is supported inside the vacuum chamber 602 by conduit support plate 638 located outside the chamber. A proximate end of the RF bias housing arm 634 is attached to the conduit support plate 638. Service openings in the conduit support plate 638 allow access to the facilities conduit 640 and RF supply conduit 622 which pass axially through the interior of the RF bias housing arm 634 to the space behind the lower electrode 606. The RF supply conduit 622 and facilities conduit 640 are at a first pressure such as atmospheric pressure and the interior of the vacuum chamber 602 is at a second pressure such as a reduced pressure by connection to a vacuum pump through a vacuum portal 680. The bellows 650 provides a vacuum seal while allowing vertical movement of the cantilever assembly.

The conduit support plate 638 is attached to the actuation mechanism 642 which travels vertically up and down relative to the vacuum chamber 602 along linear bearing 644. The linear bearing 644 is attached to the chamber wall plate 618 which provides a sidewall of the vacuum chamber 602. The chamber wall plate 618 does not move during operation of the actuation mechanism 642, but may be releasably attached to the vacuum chamber 602 to facilitate removal and insertion of the RF bias housing 630 and lower electrode assembly in the vacuum chamber 602. When the actuation mechanism 642 travels vertically relative to the vacuum chamber 602, the conduit support plate 638, and RF bias housing 630 also travel vertically in the direction indicated by arrows A-A' in FIG. 2.

The chamber wall plate 618 has stepped flange 628 forming an opening into the chamber housing 604. The RF bias housing arm 634 passes into the interior of chamber housing 604 through the opening 612 defined by the inner diameter of the stepped flange 628. An inner diameter of the stepped flange 628 defining the opening 612 is larger than an outside transverse dimension of the RF bias housing arm 634 to allow the arm 634 to move in the vertical direction A-A'. A proximate end of the RF bias housing arm 634 attaches and seals to the conduit support plate 638 in a manner such that the RF bias housing arm 634 may move vertically relative to the chamber wall plate 618. The bellows 650 creates a vacuum seal to seal the proximate end of the RF bias housing arm 634 to the chamber wall plate 618 as will now be described with reference to FIG. 3.

FIG. 3 shows the bellows 650 forming a transversely movable vacuum seal between the proximate end of the RF bias housing arm 634 and the chamber wall plate 618. An accordion appearance of the bellows 650 is not shown here. Details of bellows 650 are described further in commonly-owned co-pending U.S. Patent Application Publication No. 2008/0171444. A proximate end 650a of the bellows 650 is clamped beneath a clamp edge 654 of the RF bias housing arm 634 with an O-ring to sandwich a smaller diameter end of the proximate end 650a, between the clamp edge 654 and the conduit support plate 638. The larger diameter distal end 650b of bellows 650 is clamped beneath a clamp ring 652 to form a seal against the outside wall of the chamber wall plate 618 around a periphery of the opening 612 adjacent the inside diameter of the stepped flange 628. The clamp ring 652 is preferably bolted to the chamber wall plate 618.

The bellows 650 is substantially isolated from the vacuum chamber 602 interior by labyrinth seal 648 (see box "Q" in FIG. 3 and FIG. 4). The movable shield plate 658 extends radially from the RF bias housing arm 634 and moves vertically with the cantilever assembly. A recess around the periphery of the stepped flange 628 inner diameter on an interior surface of the chamber wall plate 618 is covered by fixed shield 656 defining the labyrinth groove 660 between the interior wall of the chamber wall plate 618 and the fixed shield 656. The movable shield plate 658 extends into the labyrinth groove 660 with a gap on either side of the movable shield plate 658 such that the movable shield plate 658 is positioned in the labyrinth groove 660 spaced apart from the walls of the labyrinth groove 660. Thereby, the movable shield plate 658 can move vertically within the labyrinth groove 660 without making contact with any surface defining the labyrinth groove 660. As depicted in FIG. 4, such a positioning of the labyrinth groove 660 creates an annular channel "B" between the fixed shield plate 656 and the movable shield plate 658 and a second channel "C" between the movable shield plate 658 and the surface of the chamber wall plate 618.

The labyrinth seal 648 substantially blocks particle migration between the interior 686 of the lateral bellows and the vacuum chamber interior 605 under vacuum processing conditions. Preferably, a ratio of a thickness of the channels "B" and "C" in the labyrinth groove 660 to a depth that the moveable shield plate 658 protrudes into the labyrinth groove 660 is in a range of about 1:8 to about 1:50. For example, the "B" and "C" channel thicknesses are the size of the gap between the movable shield plate 658 and the chamber wall plate 618 on the one side and the fixed shield plate 656 on the other.

FIG. 5A illustrates a longitudinal cross section and FIG. 5B illustrates a transverse view from the interior of the vacuum chamber 602, of an embodiment of the labyrinth seal 648 when the cantilever assembly is in a mid or neutral position (medium gap 610b). The RF bias housing arm 634 passes through the opening in the chamber wall plate 618 defined by the inner diameter of the stepped flange 628. The movable shield plate 658 is narrower than the labyrinth groove 660 such that an outer edge of the movable shield plate 658 penetrates the labyrinth groove 660 to make a non-contact particle seal between the interior 686 of the bellows 650 and the vacuum chamber interior 605. The movable shield plate 658 may be bolted to the RF bias housing arm 634 by bolts 692 or attached by a removable adhesive or the like. The fixed shield 656 may be bolted to the interior surface of the chamber wall plate 618 by bolts 690 or attached by an adhesive or other detachable joint or the like.

FIG. 6A illustrates a longitudinal cross section and FIG. 6B illustrates a transverse view from the interior of the vacuum chamber 602, of the embodiment of the labyrinth seal 648 shown in FIGS. 5A and 5B when the cantilever assembly is in a low position (large gap 610c). As depicted, the fixed shield 656 may be made up of several sections to allow installation and removal of the fixed shield 656 and installation and removal of the movable shield plate 658. For example, the fixed shield plate 656 includes a lower fixed shield portion 657 and an upper fixed shield portion 659.

While the invention has been described in detail with reference to specific embodiments thereof, it will be apparent to those skilled in the art that various changes and modifications can be made, and equivalents employed, without departing from the scope of the appended claims.

What is claimed is:

1. A plasma processing apparatus, comprising:
   a chamber comprising a sidewall separating the interior of the chamber into first and second regions, the sidewall having an opening therein providing fluid communication between the first and second regions;
   a cantilever assembly comprising an arm unit extending horizontally through the opening such that a first end is in the first region and a second end is in the second region, a substrate support being located on an upper portion of the first end;
   an actuation mechanism coupled to the second end of the arm unit and operative to move the cantilever assembly in a vertical direction; and
   a lateral bellows arrangement providing a transversely movable vacuum seal between the arm unit and the sidewall around the periphery of the opening.

2. The plasma processing apparatus of claim 1, wherein:
   the substrate support comprises a lower electrode assembly having a top surface adapted to support a substrate;
   the plasma processing chamber further comprises an upper electrode assembly having a bottom surface facing and spaced from the top surface of the substrate support to form a gap therebetween;
   the lower electrode assembly is coupled to a radio frequency (RF) power supply via an RF transmission member located in the arm unit: and
   the actuation mechanism being operable to move the substrate support to various heights relative to the upper electrode assembly to adjust the size of the gap during plasma processing of a substrate.

3. The plasma processing apparatus of claim 2, wherein the lower electrode assembly comprises an electrostatic chuck operable to clamp the substrate in place during plasma processing.

4. The plasma processing chamber of claim 1, wherein:
   the arm unit comprises an internal cavity; and
   the plasma processing chamber further comprises:
      an RF tube located in the cavity and having one end coupled to an RF power supply and being operative to transmit RF power from the RF power supply therethrough; and
      an RF conductor coupled to the other end of the RF tube and being operative to collect the RF power and to send the RF power to the substrate support.

5. The plasma processing apparatus of claim 4, wherein the RF power supply is mounted on an outer portion of the arm unit such that the RF power supply is moved with the cantilever assembly by the actuation mechanism.

6. The plasma processing apparatus of claim 1, further comprising a non-contact particle seal on the sidewall surrounding the opening, the non-contact particle seal including a fixed plate extending vertically from the arm unit and the sidewall including a slot receiving the fixed plate such that the plate does not contact the slot and an outer portion of the plate remains in the slot at all vertical positions of the arm unit.

7. The plasma processing apparatus of claim 1, wherein (a) an upper portion of the bellows is compressed and a lower portion of the bellows is expanded when the arm unit is moved to an uppermost position and (b) an upper portion of the bellows is expanded and a lower portion of the bellows is compressed when the arm unit is moved to a lowermost position.

8. The plasma processing apparatus of claim 1, wherein the bellows includes a movable bellows shield plate and a fixed bellows shield, the movable bellows plate extending from the second end of the arm unit and the fixed bellows shield being mounted on the sidewall.

9. The plasma processing apparatus of claim 1, wherein:
the actuation mechanism comprises a vertical linear bearing:
a ball screw rotatably secured to the arm unit and operative to move the arm unit when rotated; and
a motor for rotating the ball screw.

10. The plasma processing apparatus of claim 2, wherein:
the upper electrode assembly comprises at least one baffle for supplying process gas into the gap; and
the RF power supply is operable to supply RF power to the lower electrode assembly to excite the process gas to produce plasma.

11. The plasma processing apparatus of claim 2, further comprising a confinement ring assembly including at least one confinement ring configured to encircle the gap and thereby confine the plasma in the gap.

12. The plasma processing apparatus of claim 1, wherein the bellows is a laterally deflected bellows sealed at one end to an outside of the sidewall, the interior of the bellows defining the second region.

13. The plasma processing apparatus of claim 1, wherein an RF source is supported on the second end of the arm located outside of the second region.

14. The plasma processing apparatus of claim 2, wherein: (a) the substrate support includes an RF driven lower electrode and the arm unit includes a housing at the second end thereof, the housing containing circuitry providing an RF match for the electrode; (b) the arm unit includes at least one gas line operable to supply backside cooling to a substrate mounted on the substrate support: (c) the support arm includes at least one electrical connection operable to transmit signals from a sensor located in the substrate support: and/or (d) the support arm includes a fluid passage operable to circulate a heat transfer liquid in the substrate support.

15. The plasma processing apparatus of claim 1, further comprising a movable support plate located outside the chamber, the movable support plate attached to an end of the support arm and having a plurality of service openings aligned horizontally with service openings in the support arm, the movable support plate is attached to a movable annular plate which slides along the outer surface of the sidewall of the chamber along a linear guide, the annular plate defining a circumferential space around the support arm in which the bellows is located.

16. A method of processing a semiconductor substrate, comprising:
supporting a semiconductor substrate on the substrate support in the plasma processing apparatus according to claim 2;
generating plasma in the space between the upper and lower electrode assemblies;
adjusting the gap by moving the cantilever assembly via the actuation mechanism; and
processing the semiconductor substrate with the plasma.

17. The method of claim 16, wherein the processing comprises plasma etching.

* * * * *